United States Patent [19]

Blaha et al.

[11] 4,053,917
[45] Oct. 11, 1977

[54] DRAIN SOURCE PROTECTED MNOS TRANSISTOR AND METHOD OF MANUFACTURE

[75] Inventors: Franklyn C. Blaha, Glen Burnie; James R. Cricchi, Catonsville; Marvin H. White, Laurel, all of Md.

[73] Assignee: The United States of America as represented by the Secretary of the Air Force, Washington, D.C.

[21] Appl. No.: 714,412

[22] Filed: Aug. 16, 1976

[51] Int. Cl.² .................. H01L 29/78; H01L 29/34; H01L 49/02
[52] U.S. Cl. ........................ 357/23; 357/54; 357/6
[58] Field of Search ................. 357/23, 54, 6

[56] References Cited

U.S. PATENT DOCUMENTS 3,836,894   9/1974   Cricchi .................................. 357/54

Primary Examiner—Edward J. Wojciechowicz
Attorney, Agent, or Firm—Joseph E. Rusz; Willard R. Matthews, Jr.

[57] ABSTRACT

An improved drain source protected MNOS transistor is realized by means of a fabrication technique that permits independent control of memory and nonmemory parameters. Self alignment of memory regions during fabrication is achieved by using nitride masking for gate oxidation. Independent control of memory and nonmemory parameters derives from a device configuration in which protected regions consist exclusively of gate oxide and silicon nitride is present only in the memory regions. Transistor radiation hardening is also achieved by elimination of the nitride layer above the device's thin silicon dioxide regions.

1 Claim, 9 Drawing Figures

DRAIN SOURCE PROTECTED MNOS TRANSISTOR AND METHOD OF MANUFACTURE

STATEMENT OF GOVERNMENT INTEREST

The invention described herein may be manufactured and used by or for the Government for governmental purposes without the payment of any royalty thereon.

BACKGROUND OF THE INVENTION

This invention relates to drain source protected MNOS transistors, and in particular to device manufacturing techniques that provide for independent control of memory and nonmemory parameters.

The conventional drain source protected memory transistor has a deposited nitride layer that overlaps thick oxide protected non-memory regions. The thickness of the nitride layer and the charge at the nitride thick oxide interface both affect the threshold of the non-memory region. Since the operating characteristics of the drain source protected memory transistor depend on both memory and non-memory characteristics it is desirable to have independent control of their processing parameters.

The conventional MNOS memory transistor also exhibits positive charge buildup in its silicon dioxide layer when subjected to x-ray irradiation. The charge buildup results in a turn-on voltage shift that substantially degrades the transistor performance.

The present invention is directed toward providing an MNOS memory transistor that is impervious to the effects of any ionizing total noise irradiation and that also allows the threshold and operating characteristics of the non-memory and memory regions to be individually controlled.

SUMMARY OF THE INVENTION

The device of the invention is an MNOS transistor having a silicon nitride layer in the substrate gate window region (memory region) only. An initially grown gate silicon dioxide layer abuts the silicon nitride in the device substrate region. A subsequently grown gate silicon dioxide layer abuts the first and in part covers the source and drain regions. A silox parasitic field protection layer covers the second gate silicon dioxide layer. The sequence of steps in the fabrication process is such that self alignment of the memory region is accomplished by utilizing the silicon nitride as a mask for gate oxidation.

It is a principal object of the invention to provide a new and improved drain source protected transistor.

It is another object of the invention to provide a new and improved method of manufacturing a radiation hardened MNOS transistor.

It is another object of the invention to provide an MNOS transistor that is impervious to the effects of any ionizing total dose irradiation.

It is another object of the invention to provide a new and improved technique for manufacturing an MNOS transistor that allows the threshold and operating characteristics of the non-memory and memory regions to be individually controlled.

It is another object of the invention to provide a new and improved technique for manufacturing an MNOS transistor using nitride masking for gas oxidation to achieve self alignment of the memory region.

It is another object of the invention to provide a new and improved technique for manufacturing an MNOS transistor having the advantages described without increasing photo alignment tolerances of mask sequence complexity.

These, together with other objects, features and advantages will become more readily apparent from the following detailed description when taken in conjunction with the illustrative embodiment in the accompanying drawings.

DETAILED DESCRIPTION OF THE PREFERRED EMBODIMENT

Figure 1:
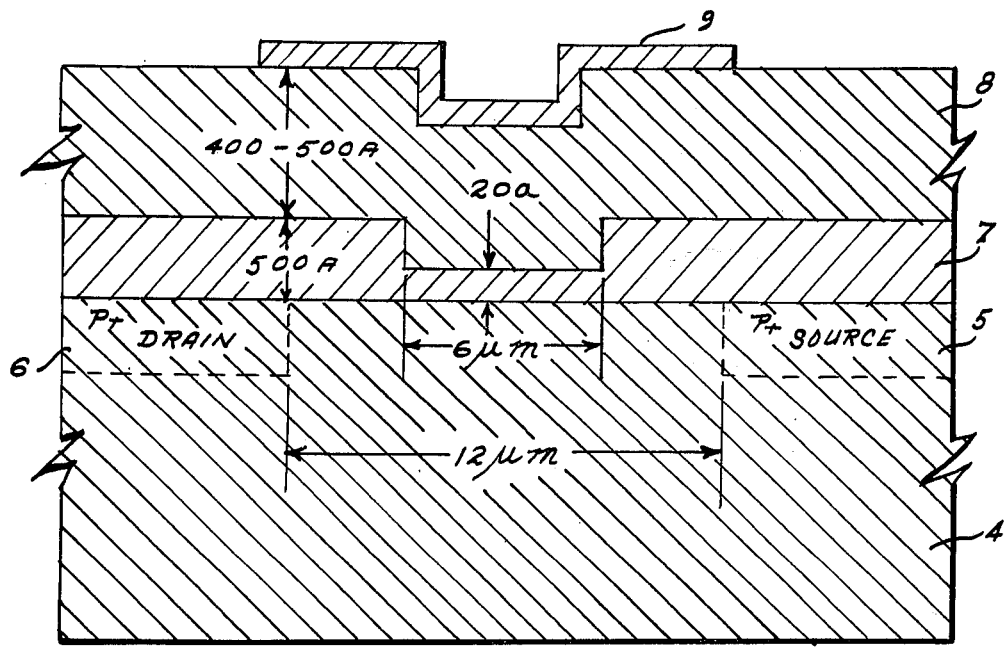
FIG. 1 is a sectional view of a portion of a prior art MNOS transistor.

A partial sectional view of a conventional drain source protected MNOS transistor is shown in FIG. 1 of the drawings. It comprises an N type silicon mesa 4 deposited in a sapphire substrate (not shown). Drain region 6 and source region 5 are established by P+ implantation. The mesa is covered with a layer 7 of silicon dioxide and a layer 8 of silicon nitride. The structure also includes gate electrode 9 and source and drain electrode (not shown).

In the standard drain source protect MNOS memory transistor shown in FIG. 1 the deposited nitride layer 8 overlaps the thick oxide protected non-memory regions. The thickness of the nitride layer 8 and the charge at the nitride thick oxide interface both affect the threshold of this non-memory region.

Since the operating characteristics of the drain source protected memory transistor depend on both the memory and non-memory characteristics, it is desirable to have independent control of their processing parameters. This is accomplished by a method of creating a drain source protected memory structure where the memory nitride is present only in the memory section of the device. In addition, the process is self-aligning such that the thermal gate oxide is grown in all regions other than the memory section. The process of the invention is hereinafter described having reference to FIGS. 2–9.

Figure 2:
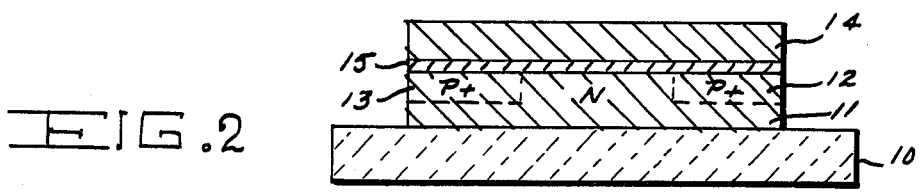
FIG. 2 is a sectional view of the MNOS transistor structure of the invention taken after the first stage of the fabrication process.
Figure 3:
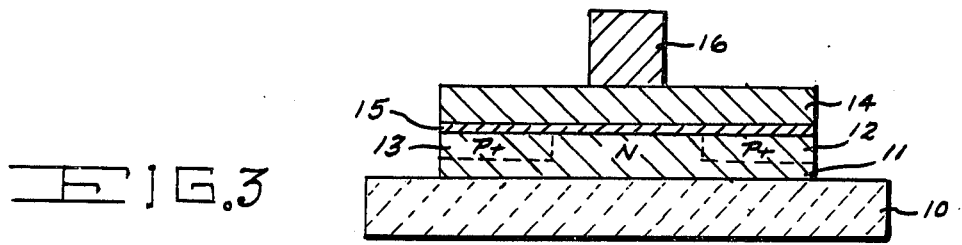
FIG. 3 is a sectional view of the MNOS transistor structure of the invention taken after the second stage of the fabrication process.
Figure 4:
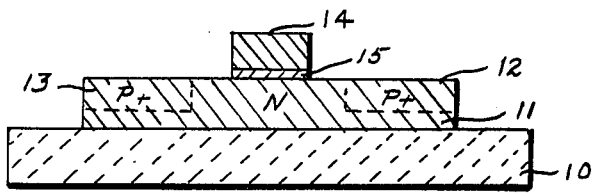
FIG. 4 is a sectional view of the MNOS transistor structure of the invention taken after the third stage of the fabrication process.
Figure 5:
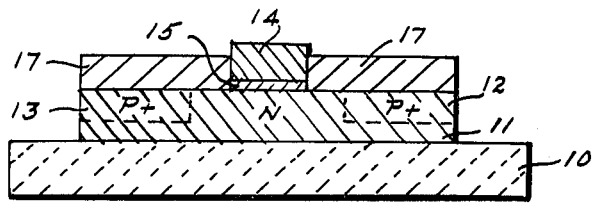
FIG. 5 is a sectional view of the MNOS transistor structure of the invention taken after the fourth stage of the fabrication process.
Figure 6:
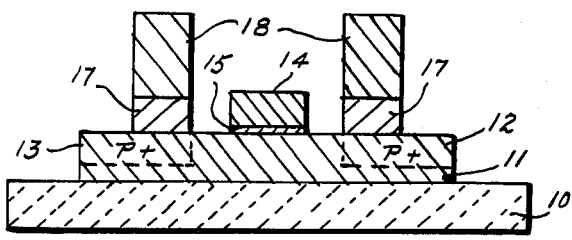
FIG. 6 is a sectional view of the MNOS transistor structure of the invention taken after the fifth stage of the fabrication process.
Figure 7:
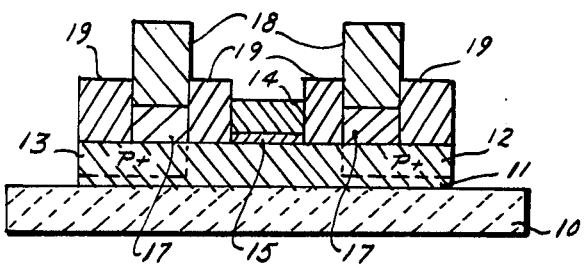
FIG. 7 is a section view of the MNOS transistor structure of the invention taken after the sixth stage of the fabrication process.
Figure 8:
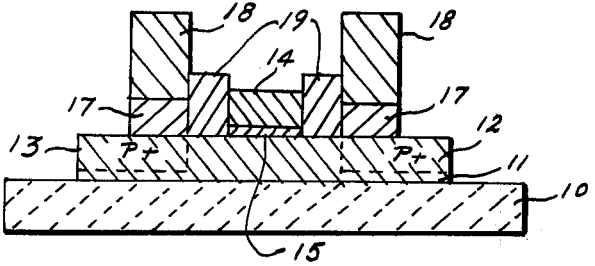
FIG. 8 is a sectional view of the MNOS transistor structure of the invention taken after the seventh stage of the fabrication process.
Figure 9:
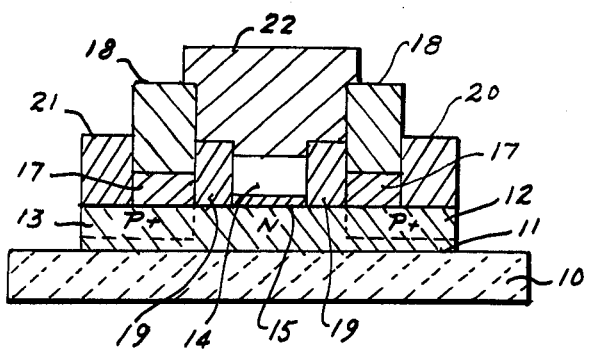
FIG. 9 is a sectional view of the MNOS transistor structure of the invention taken after the eighth and final stage of the fabrication process.

Having reference now to FIG. 2, a silicon mesa 11 is fabricated on a substrate member 10. Substrate member 10 is of electrically insulating material such as sapphire. A source region 12 and a drain region 13 are established by P+ implantation and a 20-30 A layer 15 of tunneling or memory oxide is grown over the mesa. A 300 A layer 14 of memory silicon nitride is then deposited over the tunneling oxide layer. A 2000 - 3000 A masking silox layer 16 is then deposited and etched to leave silox in the memory regions as shown in FIG. 3. The silicon nitride and tunneling oxide layers are then chemically etched and the silox is stripped to leave the isolated memory regions shown in FIG. 4. A thin gate oxidation is then performed to grow a 300 A oxide layer in all regions adjacent to silicon nitride layer 14. This is indicated by silicon dioxide layer 17 of FIG. 5. For parasitic field protection 10,000 A silox layer 18 is deposited (shown in FIG. 6)and windows are opened through to the silicon in all gate and contact window regions. A normal 1000 A gate oxide layer 19 is then grown as illustrated by FIG. 7. This oxide is then etched from the contact window regions (FIG. 8) and aluminum is deposited and photoengraved to provide source contact electrode 20, drain contact electrode 21 and gate contact electrode 22 (FIG. 9).

The use of the memory nitride as an oxidation mask to prevent the growth of the gate oxide in the memory region thus provides both the self aligning feature and the independent control of memory and non-memory sections. The technique of depositing the memory nitride and defining the memory region prior to the growth of the gate oxide, allows that oxide to be grown adjacent to and self aligned with the memory region. As the memory nitride does not interact with the gate oxide in the non-memory regions, more independent control of both nitride and oxide characteristics can be obtained.

While the invention has been described in terms of one presently preferred embodiment, it is understood that the words which have been used are words of description rather than words of limitation and that changes within the purview of the appended claims may be made without departing from the scope and spirit of the invention in its broader aspects.

What is claimed is:

1. A drain source protected MNOS transistor comprising
  a substrate of electrically insulating material,
  a mesa of N type semiconductor material deposited on the surface thereof,
  a source region formed by P+ diffusions into a portion of said mesa adjacent one edge thereof,
  a drain region formed by P+ diffusions into a portion of said mesa adjacent the edge thereof opposite said source region,
  a first region of gate silicon dioxide growth on said mesa surface covering a strip of the channel portion thereof opposite said source region,
  a second region of gate silicon dioxide growth on said mesa surface covering a strip of the channel portion thereof adjacent said drain region,
  a substrate gate window on said mesa surface in part defined by said first and second gate silicon dioxide growth regions,
  a tunneling silicon dioxide growth layer on and coextensive with said substrate gate window,
  a layer of memory silicon nitride on and coextensive with said tunneling silicon dioxide growth layer,
  a third region of gate silicon dioxide growth on said source region adjacent said first region of gate silicon dioxide,
  a fourth region of gate silicon dioxide on said drain region adjacent said second region of gate silicon dioxide,
  a first layer of silox on said third region of gate sillicon dioxide,
  a second layer of silox on said fourth region of gate silicon dioxide,
  a drain electrode,
  a source electrode, and
  a gate electrode, said first and second regions of gate silicon dioxide growth being approximately 1000 A thick, said tunneling silicon dioxide growth layer being approximately 25 A thick, said third and fourth regions of gate silicon dioxide growth being approximately 300 A thick, said first and second layers of silox being approximately 10,000 A thick, and said memory silicon nitride layer being approximately 300 A thick.

* * * * *